US007755362B2

(12) United States Patent
Stelter

(10) Patent No.: US 7,755,362 B2
(45) Date of Patent: Jul. 13, 2010

(54) ELECTRIC SWITCHING DEVICE

(75) Inventor: Achim Stelter, Kasse (DE)

(73) Assignee: Areva Energietechnik GmbH, Frankfurt (DE)

( * ) Notice: Subject to any disclaimer, the term of this patent is extended or adjusted under 35 U.S.C. 154(b) by 273 days.

(21) Appl. No.: 11/853,127

(22) Filed: Sep. 11, 2007

(65) Prior Publication Data

US 2008/0246487 A1 Oct. 9, 2008

(30) Foreign Application Priority Data

Apr. 7, 2007 (DE) ...................... 10 2007 016 720

(51) Int. Cl.
*G01R 31/327* (2006.01)

(52) U.S. Cl. ...................................................... 324/424

(58) Field of Classification Search ................. 324/424, 324/96, 133; 218/13, 51, 118
See application file for complete search history.

(56) References Cited

U.S. PATENT DOCUMENTS 4,445,017 A * 4/1984 Stewart et al. ................. 218/1
5,128,269 A * 7/1992 Oitate et al. ................ 436/126
2005/0139579 A1* 6/2005 Sakamoto et al. ........... 218/118

* cited by examiner

*Primary Examiner*—Vincent Q Nguyen
(74) *Attorney, Agent, or Firm*—Pearne & Gordon LLP

(57) ABSTRACT

An electric switchgear (10) with a pole of the switchgear filled with insulating gas is provided. A monitoring device (14) is provided for monitoring the insulating gas in the switchgear pole. A device (20) is provided that has a test connection (28) for a testing device to test the monitoring device (14). The device (20) is connected to the monitoring device (14) and the switchgear pole. The device (20) has a valve (23), with which the switchgear pole can be detached from the monitoring device (14).

10 Claims, 2 Drawing Sheets

ELECTRIC SWITCHING DEVICE

BACKGROUND

The invention concerns an electric switchgear with a pole filled with insulating gas, a monitoring device for the insulating gas in the pole of the switchgear, and a test connection for a testing device to test the monitoring device.

A three-pole high-voltage switchgear usually has three of the switchgear poles mounted on a frame. These poles can be power circuit breakers, isolating switches, grounding switches, or the like. At the foot of each pole of the switchgear, there is a case containing the drive mechanism for the respective pole of the switchgear. The cases of the three poles of the switchgear are connected to each other by another drive support and are connected to a switching drive. In the switching process, the poles of the switchgear are switched from the first switching state to a second switching state or back by the switching drive via the drive support.

Because of the high voltage being switched, the poles of the switchgear and the case that goes with them are filled with an insulating gas. For this insulating gas to be able to perform its insulating function and above all its function of quenching a potential arc, the insulating gas must be kept under a predetermined minimum pressure. This minimum pressure must be maintained for the switchgear to be able to work safely.

It is known how to monitor the pressure acting on the insulating gas. For this purpose, the cases of the three poles of the switchgear are connected to a monitoring device through a tube connection that has a pressure sensor. When the switchgear is operating, the pressure on the insulating gas is then measured at all times by the pressure sensor and monitored by the monitoring device.

But for the pressure of the insulating gas to be monitored, the pressure sensor in the monitoring device must be working and must display the correct pressure.

It is known how to check the monitoring device from time to time. This can be done by detaching the tube connection from the case, and hence from the switchgear poles. For the switchgear poles to work in this detached state, return valves must be provided to prevent the insulating gas from escaping from the switchgear poles. When the switchgear poles are separated, the monitoring device, and especially the pressure sensor in it, can be checked to see that they are working and that the measurements are precise. The free ends of the tube connection are thus provided with return valves or sealed with vent plugs. Then a testing device can be connected to the monitoring device. The pressure sensor of the monitoring device can then be submitted to a test pressure by the testing device. The pressures displayed by the testing device and the monitoring device can be compared. After the test, the testing device must be removed and the tube connection reconnected to the cases and the switchgear poles.

Obviously, the process described above for checking the monitoring device is very time-consuming. Some of the measures required, namely detaching and reconnecting the tube connection to the switchgear poles, must be done in direct proximity to these poles. This is only possible if special measures are taken to protect the test personnel, since the switchgear is most often operating and powered up during the tests, so the test personnel must be prevented from getting too close to live parts.

The problem of the invention is to create an electric switchgear in which it is possible to check the monitoring device for the insulating gas in a less time-consuming way.

The invention solves this problem with the electric switchgear in laim 1.

BRIEF SUMMARY

The electric switchgear in the invention has a pole filled with insulating gas and a monitoring device for the insulating gas in the switchgear pole. It also has a test connection for a tester to check the monitoring device. The invention has a device with a test connection. The device is connected to the monitoring device and the switchgear pole. The device also has a valve with which the switchgear pole can be separated from the monitoring device.

The valve makes it simple to separate the switchgear poles from the monitoring device. It is therefore unnecessary to remove the tube connection from the switchgear poles.

The device in the invention also has a test connection to which the monitoring device can be connected for testing. Here again, it is unnecessary to remove the tube connection. Instead, the tester can simply be connected to the test connection and the monitoring device can be tested.

Another basic advantage of the invention is that the device can be made completely independent of the switchgear poles. This means the device need not be in the area near the switchgear poles, so no special measures need be taken to protect the test personnel.

Preferably, it is possible, if necessary, to arrange the device in the invention, along with the monitoring device, so it is a distance from the switchgear poles. Thus, the monitoring device and the testing itself can be a distance from the testing device, and the testing can be done completely independently of the switchgear poles.

One advantageous embodiment of the invention has a plunger with which the valve can be switched. The plunger makes it easy for test personnel to detach the switchgear poles from the monitoring device to test the monitoring device and to reconnect the monitoring device to the switchgear poles.

One initial alternative has the advantage of a locking cap that is separate from the plunger. The test connection of the device can be closed with the locking cap. When the test connection is closed, the plunger switches the valve so that the switchgear pole and the monitoring device are connected to one another.

When the switchgear is operating normally, the test connection is closed with the locking cap. Thus, the valve is switched by the plunger to a state in which the monitoring device and the switchgear poles are connected to one another. This means that the pressure acting on the insulating gas is tested by the monitoring device.

To check to see that the monitoring device is working, the locking cap is taken off the test connection and the tester is connected to the test connection instead. Because the locking cap is off, the valve is no longer held in the position in which the switchgear poles are connected to the monitoring switch. Instead, the valve switches over and separates the switchgear poles from the monitoring device. In this state, the monitoring device can be tested by the tester without affecting the switchgear poles.

After the monitoring device is tested, the testing device is removed from the test connection, and the test connection is closed again with the locking cap. Because the plunger is connected to the locking cap, the valve automatically goes back to the position in which the switchgear poles are connected to the monitoring device.

The plunger connected to the locking cap guarantees that when the locking cap is removed, the switchgear poles are automatically separated from the monitoring device and that, vice versa, when the locking cap is in place, the pole switchgear poles are automatically reconnected to the monitoring device. This makes malfunctions by test personnel impossible.

A second alternative has the advantage of a plunger inside the device. The test connection of the device can be closed with a locking cap. The projection on the locking cap acts on the plunger when the test connection is closed. The valve is switched by the plunger when the test connection is closed, so that the switchgear pole and the monitoring device are connected to one another.

When the switchgear is operating normally, the test connection is closed by the locking cap. Thus, the valve is open and the monitoring device checks the pressure acting on the insulating gas. When the locking cap is removed, the valve switches over and separates the switchgear pole from the monitoring device. In this state, the monitoring device can now be checked using the testing device. After testing the monitoring device, the test connection is re-closed with the locking cap.

Having the locking cap hit the plunger guarantees that when the locking cap is removed, the switchgear poles are automatically separated from the monitoring device and, vice versa, when the locking cap is in place, the switchgear poles are automatically reconnected to the monitoring device. This makes malfunctions by test personnel impossible.

In another advantageous embodiment of the invention, there is a projection in the area near the test connection that is assigned to a return valve located in the top part of a testing device. The test connection can be closed off from the top part, and the return valve is opened by means of the projection if the test connection is closed with the top part. This measure makes it possible to use a testing device that has a return valve.

In another advantageous embodiment of the invention, the valve is designed as a spring-loaded valve that has no other effect when closed and separates the pole of the switchgear from the monitoring device. This is a very simple, but functionally safe way of making the valve.

Preferably, the valve is switched to the open position by the plunger against the force of a valve spring in which the switchgear pole is connected to the monitoring device. These measures are simple and yet guarantee a high degree of operating safety.

Other features, applications, and advantages of the invention can be found in the following description of examples of embodiment of the invention, which are shown in the figures on the drawings. All of the features described or shown, by themselves or in any combination, are the subject of the invention, regardless of how they are put together in the patent claims or their relationship, and regardless of their wording or depiction in the description or the drawings.

DETAILED DESCRIPTION

Figure 1:
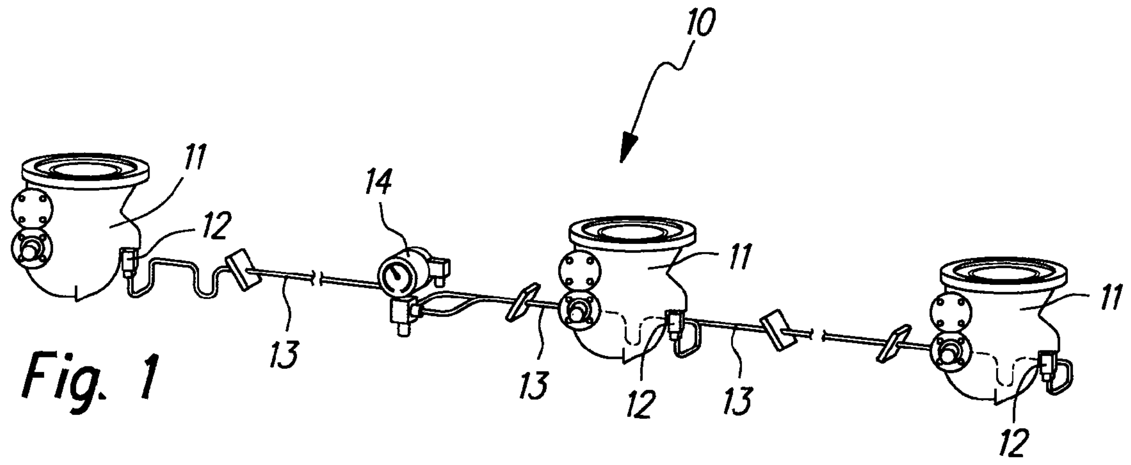
FIG. 1 shows a schematic perspective drawing of a part of an electric switchgear with a monitoring device for an insulating gas.
Figure 2:
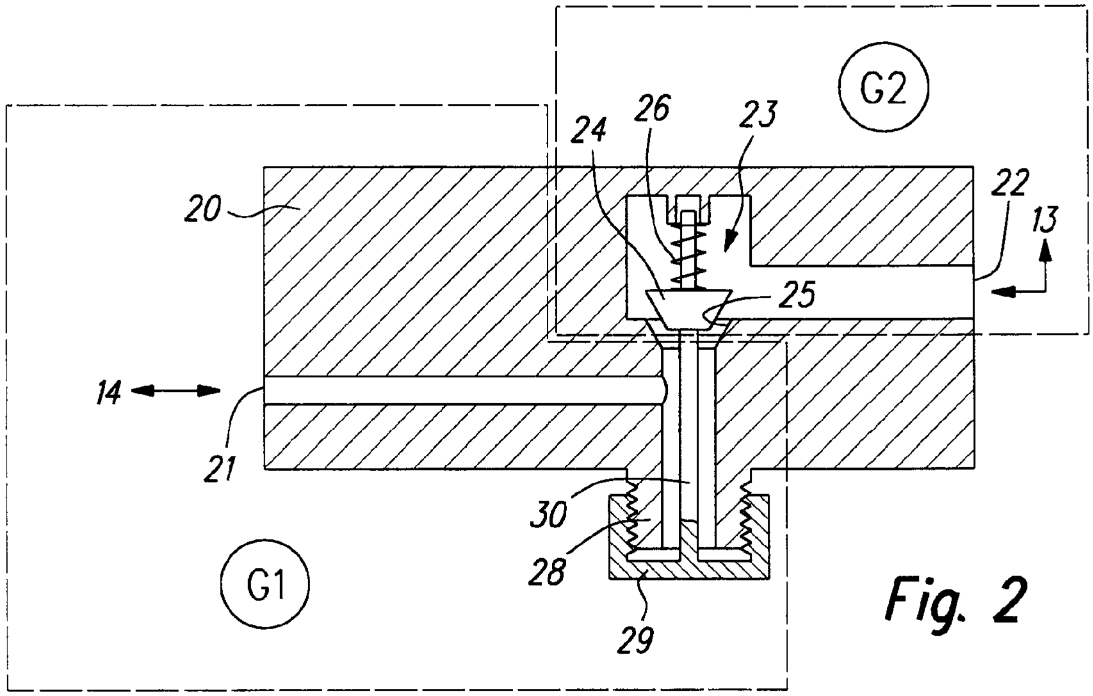
FIG. 2 shows a schematic sectional drawing of a first example of embodiment of the device in the invention to test the monitoring device in FIG. 1.

FIGS. 1 to 3 are examples for a three-pole high-voltage circuit breaker. Instead of the circuit-breaker poles, isolating poles or grounding poles or, in general, any other type of poles for a switchgear can be provided.

FIG. 1 concerns a three-pole electric switchgear 10, with which a high voltage can be turned on and off. FIG. 1 shows three cases 11, on top of which a circuit-breaker pole can be mounted. The drive mechanism for the circuit-breaker poles is inside the cases 11. The other drive support with which the three cases 11 are connected to one another and to a drive box is not shown in FIG. 1.

All three cases 11 and the accompanying circuit-breaker poles are filled with an insulating gas, for example sulfur hexafluoride SF6. The cases 11 are provided with a coupling 12 for filling them. FIG. 1 shows the three couplings 12 connected to a monitoring device 14 by a tube connection 13 so they are gas-tight. This monitoring device 14 can be placed in the area near the switchgear 10, but also independently of it.

When the circuit-breaker poles are operating, the insulating gas must be under a predetermined minimum pressure in the poles. To monitor this minimum pressure, there is a pressure sensor, for example a manometer, in the monitoring device 14. The pressure acting on the insulating gas in the circuit-breaker poles and the cases 11 is forwarded to the monitoring device 14 and hence to the pressure sensor by the couplings 12 and the tube connection 13. The monitoring device 14 measures the pressure and compares it with the predetermined minimum pressure. If the pressure measured falls below the minimum pressure, the monitoring device 14 triggers an alarm signal.

FIG. 2 shows a device 20 for testing the monitoring device 14 in FIG. 1. The device 20 can be separate from the monitoring device 14 or can form one component in common with the monitoring device 14. The device 20 can be placed in the area near the switchgear 10, but separate from it. The arrangement of the monitoring device 14 in relation to device 20 is indicated by an arrow in FIG. 2. The same is true of the tube connection 13.

The device 20 has a connection 21, to which the monitoring device can be connected. The device 20 also has a connection 22, to which the tube connection 13 can be connected. These two connections 21, 22 are connected to one another inside device 20 by a duct.

A spring-loaded valve 23 is provided in the duct with which the duct can be closed. For this purpose, the valve 23 has a sliding valve plate 24, which is assigned to a valve seat 25 inside the device 20. The valve plate 24 has a valve spring 26 loaded so that it is gas tight and sits on the valve seat 25, with no other effect so that the valve 23 is closed. Means of guiding the valve plate 24 and the valve spring 26 are provided but are not explained in greater detail.

The device 20 has a test connection 28, which is connected to the duct. The connection is provided on the side of the valve 23 assigned to connection 21, and hence the monitoring device 14. The test connection 28 is thus always connected to the monitoring device 14, regardless of what setting the valve 23 is in.

The test connection 28 can be closed by a locking cap 29 so that it is gas tight. For this purpose, the locking cap 29 can be screwed on a corresponding thread on the test connection 28, for example. The locking cap 29 is provided with a plunger 30 on the side facing the device 20, which, when screwed in, projects through the test connection 28 to the inside of the duct and hence to the inside of the device 20. The plunger 30 is not connected to the valve plate 24. The locking cap 29 and the plunger 30 are designed and arranged in relation to the valve 23, however, in such a way that when the locking cap is screwed on, the plunger 30 lifts the valve plate 24 off the valve seat 25 against the force of the valve spring 26. The valve 23 can thus be switched using the plunger 30. The valve 23 is then opened.

The valve 23 is opened by screwing on the locking cap, while the valve 23 is closed when the locking cap 29 is removed. FIG. 2 shows valve 23 open.

The connection 21, hence the monitoring device 14 and the test connection 28 form a first gas area G1. The connection 22, hence the tube connection 13 with the case 11 and the circuit-breaker poles, form a second gas area G2. This is shown by dashes in FIG. 1.

When the locking cap 29 is screwed on and the valve 23 is thus open, the two gas areas G1 and G2 are connected to one another. At the same time, the test connection 28 is closed by the locking cap 29 so it is gas tight. The pressure acting on the insulating gas in the cases 11 and the circuit-breaker poles is forwarded to the monitoring device 14 by the open valve 23. There, the pressure is monitored, as explained.

When the locking cap 29 is unscrewed and the valve 23 is closed, the two gas areas G1 and G2 are separated from each other and are gas tight. The cases 11 and the circuit-breaker poles are thus separated from the monitoring device 14 so they are gas tight. The test connection 28 is open.

A testing device, not shown, for checking the monitoring device 14 can be connected to the test connection 28. With this testing device, a changing test pressure can be produced and displayed by means of a gas. This test pressure can preferably be produced with the same insulating gas with which the circuit-breaker poles are filled.

This test pressure acts on the monitoring device 14 via the test connection 28 and especially on the pressure sensor there. The test pressure displayed by the testing device can be compared with the pressure measured by the monitoring device 14. That way, the monitoring device 14, and especially its pressure sensor, can be tested for function and measurement precision.

Because valve 23 is closed, the whole test of the monitoring device 14 described above is in the first gas area G1, and has no influence on the insulating gas in the second gas area G2. The valve spring 26 is dimensioned in such a way that the valve 23 remains safely closed by the test pressures produced by the testing device.

After the monitoring device 14 is tested, the testing device is removed again, and the locking cap 29 is screwed back on, so that the valve 23 opens. The insulating gas spreads out in both gas areas G1 and G2 and the pressure on the insulating gas is monitored again by the monitoring device 14.

Figure 3B:
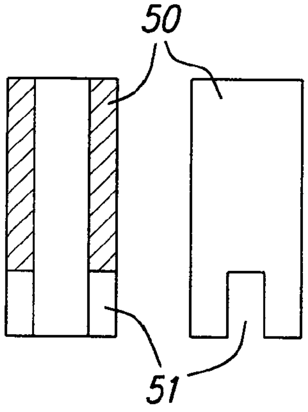
FIG. 3*b* shows a schematic sectional drawing and view of the plunger of the device in FIG. 3*a*.
Figure 3C:
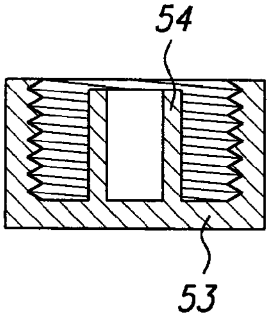
FIG. 3*c* shows a schematic sectional drawing of a locking cap for the device in FIG. 3*a*.
Figure 3A:
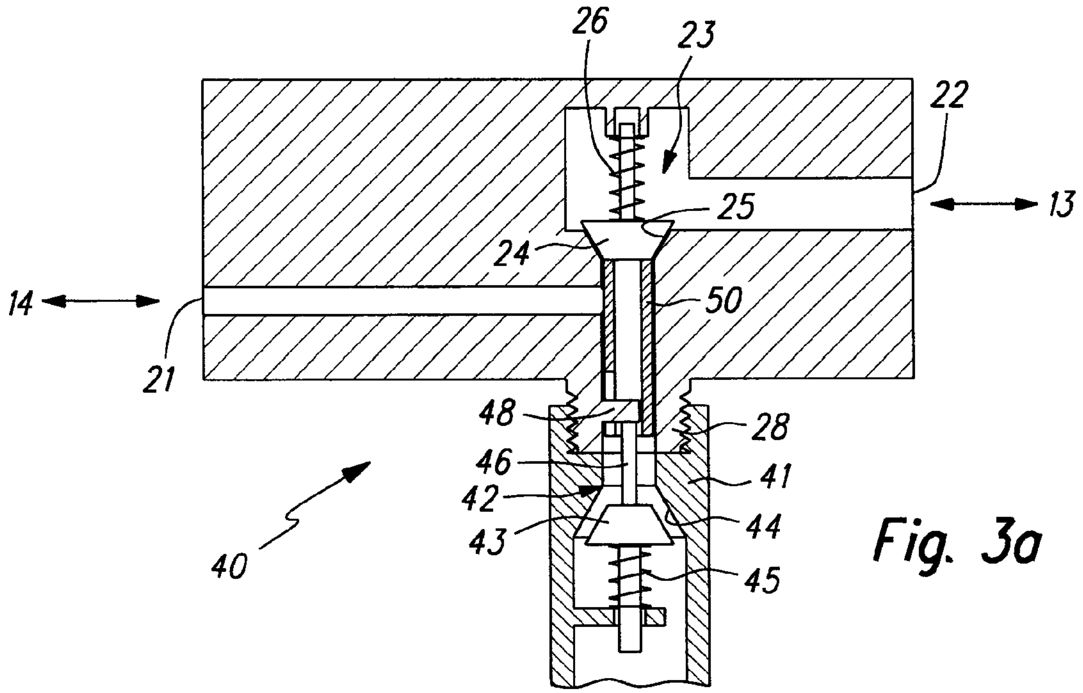
FIG. 3*a* shows a schematic sectional drawing of a second example of embodiment of the device in the invention to test the monitoring device in FIG. 1.

FIGS. 3*a* to 3*c* show a device 40 for testing the monitoring device 14 in FIG. 1. The device 40 in FIGS. 3*a* to 3*c* is largely identical to the device 20 in FIG. 2. Comparable components are therefore marked with the same reference numbers. Please refer to the explanations of these components in connection with FIG. 2. The following basically explains only deviations from and differences in the device 40 in FIGS. 3*a* to 3*c*.

Unlike device 20 in FIG. 2, device 40 in FIGS. 3*a* to 3*c* is designed so that a testing device that has a return valve can be connected to it.

FIG. 3*a* shows the device 40 along with a top part 41, whereby the top part 41 belongs to the testing device and contains a return valve 42. The return valve 42 has a valve plate 43, a valve seat 44 and a valve spring 45. The valve plate 43 is arranged so it can slide, and the valve seat 44 is placed inside the top part 41. The valve plate 43 is loaded by the valve spring 45 in such a way that the valve plate 43 sits on the valve seat 44 and is gas tight with no other effects. The return valve 42 is closed in this state. This state is not shown in FIG. 3*a*.

On the side facing away from the valve seat 44, the valve plate 43 is provided with a plunger 46. Means that are not described in greater detail are provided with which the valve pate 43 and the valve spring 45 are held and guided.

Independently of the device 40, i.e., when it is taken off, the return valve 42 in the top part 41 of the testing device is closed. As mentioned, this state is not shown in FIG. 3*a*.

Instead, FIG. 3*a* shows a state in which the top part 41 is screwed to the test connection 28 of device 40. Inside device 40, there is a projection 48 in the area near the test connection 28. This projection 48 and the plunger 46 are designed in such a way and coordinated so that when the top part 41 is screwed on, the valve plate 43 is lifted off the valve seat 44. The return valve 42 is then opened. As mentioned, this open state of the return valve 42 is shown in FIG. 3*a*.

On device 40 in FIG. 3*a*, there is a plunger 50 that is different from the plunger 30 in device 20 of FIG. 2 in that it is designed to be tube-shaped and to have a slot 51 on its free end. The plunger 50 is not connected to either the valve plate 24 of valve 23 or to a locking cap, but is designed as a separate component.

This plunger 50 is shown in detail in FIG. 3*b*.

According to FIG. 3*a*, the projection 48 goes through the longitudinal slot 51 of the plunger 50. The longitudinal slot 51 is designed in such a way that the plunger 50 can move freely without being limited by the projection 48. Due to the tubular design of the plunger 50, it can also move freely in relation to the plunger 46 of the return valve 42. The movements of the plunger 50 of valve 23 and the plunger 46 of the return valve are thus independent of one another.

When the top part 41 is screwed on—as explained—the return valve 42 is opened. Also, as explained in connection with FIG. 2, the valve 23 is closed because the locking cap is off. This state is shown in FIG. 3*a*. The test gas can now flow via the free access of the top part 41 and—as explained—the monitoring device 14 tested.

After the test, the testing device with the top part 41 is taken off again and the return valve 42 closes. The valve 23 of the device 40 is not affected by unscrewing the top part 41 and stays closed.

After that, a locking cap 53 is screwed to the test connection 28 instead of the top part 41. Unlike the locking cap 29 in device 20 in FIG. 2, this locking cap 53 has no plunger, but does have a tubular projection 54 which, when the locking cap 53 is screwed on, projects through the test connection 28 to the space inside the device 40.

The locking cap 53 with the tubular projection 54 is shown in detail in FIG. 3*c*.

When the locking cap 53 is screwed on, the tubular projection 54 moves to the free end of the plunger 50 and moves the plunger 50 in the direction of the valve 23. Thus, the valve plate 24 of valve 23 is lifted off the valve seat 25 and the valve 23 is opened.

The test connection 28 is thus closed by the locking cap 53 and is gas tight, and the monitoring device 14 is connected to the circuit-breaker poles by the tube connection 13. The monitoring device 14 monitors the pressure acting on the insulating gas, as explained.

The invention claimed is:

1. An electric switchgear comprising: a pole filled with insulating gas, a monitoring device for monitoring the pressure of the insulating gas in the pole of the switchgear, and a component that has a test connection for connecting a testing device to test the monitoring device, wherein the component has a first gas connection to the monitoring device and has a second gas connection to the pole of the switchgear, and the component has a valve that switches over to separate the insulating gas of the second gas connection to the switchgear pole from the first gas connection to the monitoring device.

2. The switchgear in claim 1, whereby when the insulating gas in the switchgear pole is switched over to separate the insulating gas from the monitoring device, the testing device is connected to the test connection.

3. The switchgear in one of the preceding claims, whereby a plunger is provided with which the valve is switched off and on.

4. The switchgear in claim 3, whereby a locking cap is provided, from which the plunger projects, whereby the test connection of the component is closed with the locking cap, and whereby the valve is switched by the plunger when the test connection is closed, so that the switchgear pole and the monitoring device are connected to one another.

5. The switchgear in claim 3, whereby the plunger is inside the component, whereby the test connection of the component is closed with a locking cap , whereby a projection on the locking cap acts on the plunger when the test connection is closed, and whereby the valve is switched on and off by the plunger when the test connection is closed, so that the switchgear pole and the monitoring device are connected to one another.

6. The switchgear in claim 5, whereby a projection is provided in the area near the test connection the projection being assigned to a return valve found in the top part of a testing device, whereby the test connection is closed by the top part and whereby the return valve is opened by means of the projection if the test connection is closed with the top part.

7. The switchgear in claim 1, whereby the valve is designed as a spring-loaded valve, which, without any action, is closed and separates the switchgear pole from the monitoring device.

8. The switchgear in claim 3, whereby the valve is switched by the plunger against the force of a valve spring whereby the switchgear pole is connected in the open position to the monitoring device.

9. The switchgear in claim 1, whereby the monitoring device is provided with a pressure sensor, and whereby when the switchgear pole is detached from the monitoring device and when the testing device is connected to the test connection, the pressure sensor is function-tested.

10. The switchgear in claim 1, whereby when the switchgear pole is connected to the monitoring device, the pressure acting on the insulating gas in the switchgear pole is tested with the monitoring device.

* * * * *

UNITED STATES PATENT AND TRADEMARK OFFICE

CERTIFICATE OF CORRECTION

PATENT NO. : 7,755,362 B2
APPLICATION NO. : 11/853127
DATED : July 13, 2010
INVENTOR(S) : Achim Stelter It is certified that error appears in the above-identified patent and that said Letters Patent is hereby corrected as shown below:

On the Title page, section "Inventor" should read as follows:

--(75) Inventor: Achim Stelter, Kassel (DE)--

Signed and Sealed this

Ninth Day of November, 2010

David J. Kappos

David J. Kappos
*Director of the United States Patent and Trademark Office*